(12) United States Patent
Chen et al.

(10) Patent No.: US 8,941,159 B2
(45) Date of Patent: Jan. 27, 2015

(54) COLOR FILTER INCLUDING CLEAR PIXEL AND HARD MASK

(71) Applicant: OmniVision Technologies, Inc., Santa Clara, CA (US)

(72) Inventors: Gang Chen, San Jose, CA (US); Duli Mao, Sunnyvale, CA (US); Hsin-Chih Tai, San Jose, CA (US); Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 93 days.

(21) Appl. No.: 13/754,465

(22) Filed: Jan. 30, 2013

(65) Prior Publication Data
US 2014/0210028 A1  Jul. 31, 2014

(51) Int. Cl.
*H01L 21/02* (2006.01)
*H01L 27/146* (2006.01)
*G02B 5/20* (2006.01)
*G02B 1/10* (2006.01)

(52) U.S. Cl.
CPC ......... *H01L 27/14621* (2013.01); *G02B 5/201* (2013.01); *G02B 1/105* (2013.01)
USPC .... 257/291; 257/432; 257/435; 257/E21.527; 257/E31.127

(58) Field of Classification Search
CPC .............. H01L 27/146; H01L 27/1463; H01L 27/14621

USPC .............. 257/291, 432, 435, E21.527, 31.127
See application file for complete search history.

(56) References Cited

U.S. PATENT DOCUMENTS

| 7,518,683 B2 * | 4/2009 | Inoue et al. ................... 349/129 |
| 7,935,560 B2 * | 5/2011 | Anderson et al. .............. 438/70 |
| 2010/0196683 A1 * | 8/2010 | Haskal ......................... 428/212 |
| 2011/0226934 A1 * | 9/2011 | Tian et al. ................... 250/208.1 |
| 2013/0033627 A1 | 2/2013 | Chen et al. |
| 2013/0181268 A1 * | 7/2013 | Hirota .......................... 257/291 |
| 2013/0316487 A1 * | 11/2013 | de Graff et al. ................. 438/66 |

OTHER PUBLICATIONS

CN 2011-10461303.X—First Chinese Office Action with English Translation, issued Sep. 3, 2014, 19 pages.
TW 100144238—First Taiwan Office Action with English Translation, issued Oct. 17, 2014, 14 pages.

* cited by examiner

*Primary Examiner* — Michael Lebentritt
(74) *Attorney, Agent, or Firm* — Blakey Sokoloff Taylor & Zafman LLP

(57) ABSTRACT

Embodiments of an apparatus including a color filter arrangement formed on a substrate having a pixel array formed therein. The color filter arrangement includes a clear filter having a first clear hard mask layer and a second clear hard mask layer formed thereon, a first color filter having the first clear hard mask layer and the second hard mask layer formed thereon, a second color filter having the first clear hard mask layer formed thereon, and a third color filter having no clear hard mask layer formed thereon. Other embodiments are disclosed and claimed.

8 Claims, 7 Drawing Sheets

PLAN VIEW

SECTION B-B'

US 8,941,159 B2

COLOR FILTER INCLUDING CLEAR PIXEL AND HARD MASK

TECHNICAL FIELD

The described embodiments relate generally to image sensors and in particular, but not exclusively, to color filter patterning in an image sensor using a hard mask.

BACKGROUND

With pixel size scaling down, design rules for color filters should follow the trend and allow the color filters to be scaled down as well, but due to specific processing features of the color filters the scaling is challenging and painful. Introducing new materials is a common approach for improving color filter scaling, but light transmission, process controllability, yield, delivery, and overall optical performance could be sacrificed.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Embodiments of an apparatus, system and method for color filter patterning using a hard mask are described. Numerous specific details are described to provide a thorough understanding of the embodiments of the invention, but one skilled in the relevant art will recognize that the invention can be practiced without one or more of the specific details, or with other methods, components, materials, etc. In some instances, well-known structures, materials, or operations are not shown or described in detail but are nonetheless encompassed within the scope of the invention.

Reference throughout this specification to "one embodiment" or "an embodiment" means that a particular feature, structure, or characteristic is included in at least one described embodiment. Thus, appearances of the phrases "in one embodiment" or "in an embodiment" in this specification do not necessarily all refer to the same embodiment. Furthermore, the particular features, structures, or characteristics may be combined in any suitable manner in one or more embodiments.

Figure 1A:
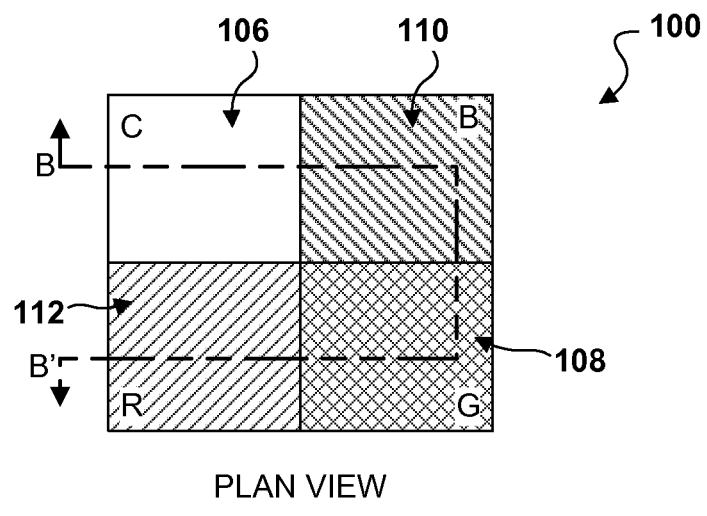
FIG. 1A is a cut-away plan view of an embodiment of a color filter arrangement.
Figure 1B:
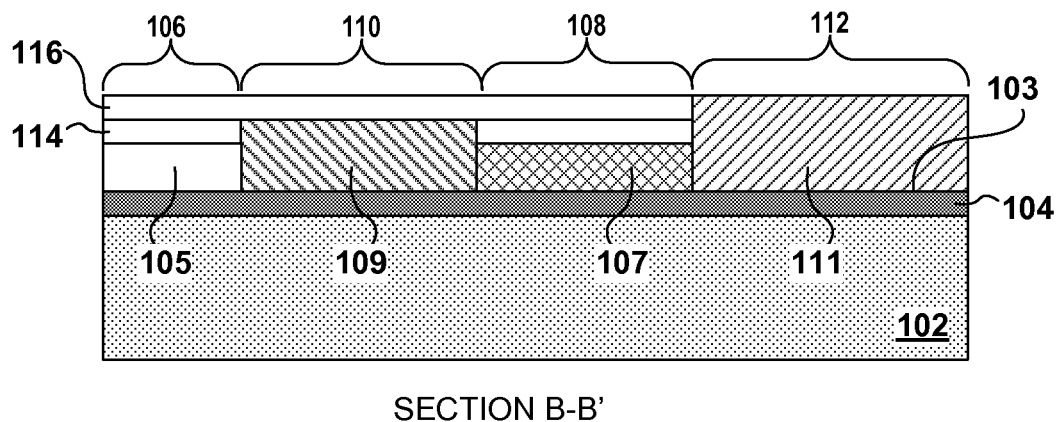
FIG. 1B is a cross-sectional view of the embodiment of a color filter arrangement shown in FIG. 1A, taken substantially along section line B-B'.

FIGS. 1A-1B illustrate an embodiment of a color filter arrangement 100 for a group of four pixels; FIG. 1A is a cut-away plan view that omits the hard mask layers shown in FIG. 1B, while FIG. 1B a cross-sectional view taken substantially along section line B-B'. Color filter arrangement 100 can be implemented in a frontside-illuminated (FSI) sensor, as shown in FIG. 2B, or in a backside-illuminated (BSI) sensor, as shown in FIG. 2C.

Color filter arrangement 100 includes four filters: a clear filter 106 (i.e., a filter that is substantially colorless and/or optically transparent over a range of wavelengths that includes at least the range of wavelengths of the other filters in the arrangement), a filter 108 of a first color, a filter 110 of a second color, and a filter 112 of a third color. In the illustrated embodiment the first color is green, the second color is blue and the third color is red, so that color filter arrangement 100 forms a red-green-blue-clear (RGBC) filter pattern. In other embodiments, however, there can be different numbers of each color and the colors can be arranged differently than shown. In still other embodiments the colors used in the filter arrangement can be different—cyan, magenta and yellow (CMY) instead of RGB, for instance—and can have any distribution and any number of each color.

Clear filter 106 and color filters 108, 110 and 112 are formed on surface 103 of optional planarization layer 104. A first hard mask layer 114 and a second hard mask layer 116 are formed over clear filter 105 and color filter material 107, while only second hard mask layer 116 is formed over color filter material 109. In the illustrated embodiment no hard mask layer is formed over color filter material 111, but in other embodiments an additional clear layer can be formed over filter material 111 and second hard mask layer 116 (see FIG. 3J). Hard mask layers 114 and 116 are clear (i.e., substantially colorless) and optically transparent in a range of wavelengths that includes at least the wavelengths of the color filters. In the illustrated embodiment, one or both of hard mask layers 114 and 116 can be made of the same clear material as clear filter 106. In one embodiment hard mask layers 114 and 116 are oxide layers, but in other embodiments other materials can be used provided they meet optical performance and manufacturing requirements. By using oxides or other materials with good light transmission properties, the "old" low cost, mature, optimized color filter materials can extend their application to pixels of any size, the only limit being patterning resolution, which is smaller than the shortest wavelength of the visible light.

Figure 2A:
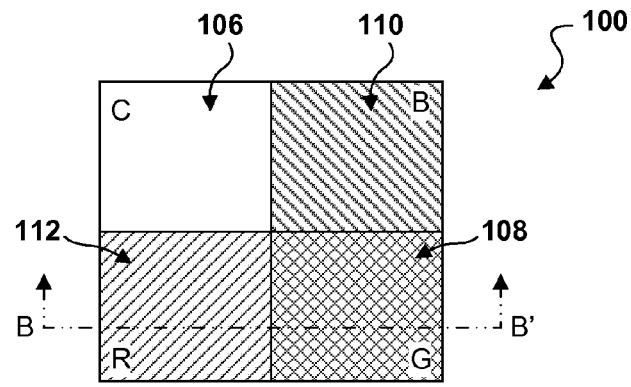
FIG. 2A is another plan view of the color filter arrangement shown in FIG. 1A.
Figure 2B:
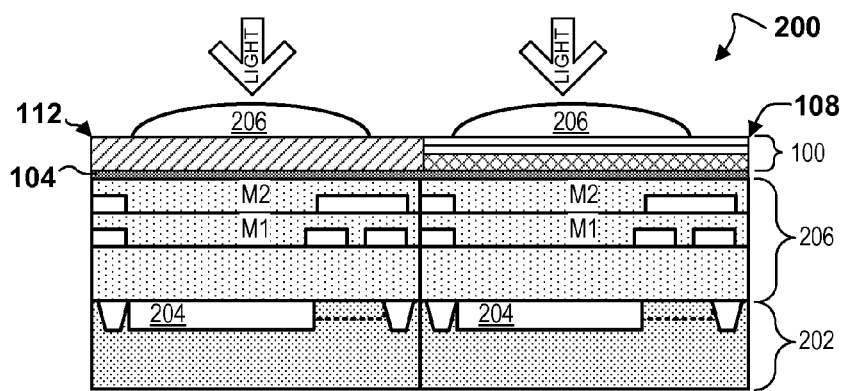
FIG. 2B is a cross-sectional view of the embodiment of a color filter arrangement shown in FIG. 2A, taken substantially along section line B-B' and used together with an embodiment of frontside-illuminated pixels.
Figure 2C:
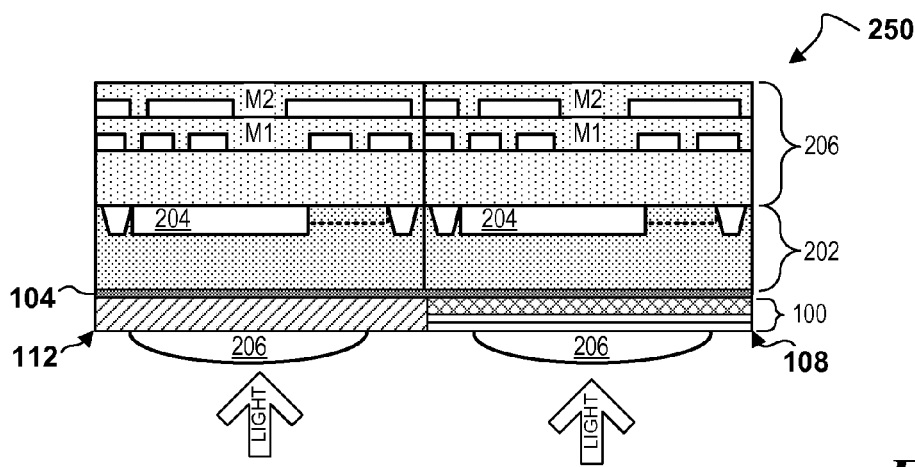
FIG. 2C is a cross-sectional view of the embodiment of a color filter arrangement shown in FIG. 2A, taken substantially along section line B-B' and used together with an embodiment of backside-illuminated pixels.

FIGS. 2A-2C illustrate embodiments in which color filter arrangement 100 can be used together with frontside-illuminated (FSI) pixels (FIG. 2B) or backside-illuminated (BSI) pixels (FIG. 2C). The figures illustrate the application of color filter arrangement 100 to a group of four pixels, but in an actual pixel array having large numbers of pixels the illustrated filter and pixel arrangement can be replicated numerous times depending on the number of pixels in the array.

FIG. 2A illustrates color filter arrangement 100, which includes four filters: a clear (i.e., substantially colorless) filter 106, a filter 108 of a first color, a filter 106 of a second color, and a filter 108 of a third color. In the illustrated embodiment the first color is green, the second color is blue and the third color is red, and the clear filter and the three color filters are arranged to form a red-green-blue-clear (RGBC) filter pattern. In other embodiments, however, there can be different numbers of each color and the colors can be arranged differently than shown. In still other embodiments the colors used with clear filter 106 in filter arrangement 100 can be different—cyan, magenta and yellow (CMY), for instance—and can have any arrangement and any number of each color.

FIG. 2B illustrates a cross-section, taken along section B-B' in FIG. 2A, of an embodiment of frontside-illuminated (FSI) pixels 200 in a CMOS image sensor, where the FSI pixels 200 use a color filter arrangement such as color filter arrangement 100. The front side of FSI pixels 200 is the side of substrate 202 upon or in which photosensitive region 204 and its associated pixel circuitry are disposed, and over which metal stack 206 is formed for redistributing signals. Metal stack 206 includes metal layers M1 and M2, which are patterned to create an optical passage through which light incident on the FSI pixels 200 can reach photosensitive or photodiode ("PD") regions 204. To implement a color image sensor, the front side includes color filter arrangement 100, with its clear filter and color filters (color filters 108 and 112 are illustrated in this particular cross section) disposed under microlenses 206 that aid in focusing the light onto photosensitive region 204.

FIG. 2C illustrates a cross-section, taken along section B-B' in FIG. 2A, of an embodiment of backside-illuminated (BSI) pixels 250 in a CMOS image sensor, where the BSI pixels use a color filter arrangement such as color filter arrangement 100. As with pixels 200, the front side of pixels 250 is the side of substrate 202 upon or in which photosensitive regions 204 and its associated pixel circuitry are disposed, and over which metal stack 206 is formed for redistributing signals. The backside of pixels 250 is the side of the substrate opposite the front side. To implement a color image sensor, the backside includes color filter arrangement 100, with its clear filter and color filters (color filters 108 and 112 are illustrated in this particular cross section) disposed under microlenses 206. Microlenses 206 aid in focusing the light onto photosensitive regions 204. Backside illumination of pixels 250 means that the metal interconnect lines in metal stack 206 do not obscure the path between the object being imaged and the photosensitive regions 204, resulting in greater signal generation by the photosensitive regions.

Figure 3A:
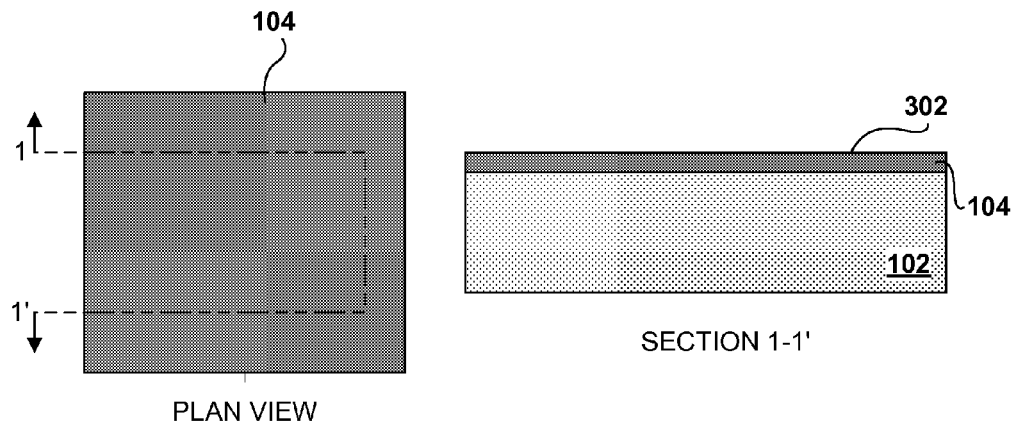
FIGS. 3A-3J are plan views (left side) and corresponding cross-sectional views (right side) illustrating an embodiment of a process for manufacturing a color filter arrangement such as the one shown in FIGS. 1A-1B and/or 2A-2C.

FIGS. 3A-3J illustrate an embodiment of a process for manufacturing an embodiment of a color filter arrangement such as color filter arrangement 100. FIG. 3A shows an initial part of the process, which begins with substrate 102 having a planarizing layer 104 deposited thereon and planarized using processes such as chemical mechanical polishing (CMP) to form a planar surface 302 on which color filter arrangement 100 can be formed. In other embodiments planarizing layer 104 can be omitted and the rest of the filter arrangement formed directly on substrate 102. Still other embodiments can include planarization layer 104 as well as additional layers.

Figure 3B:
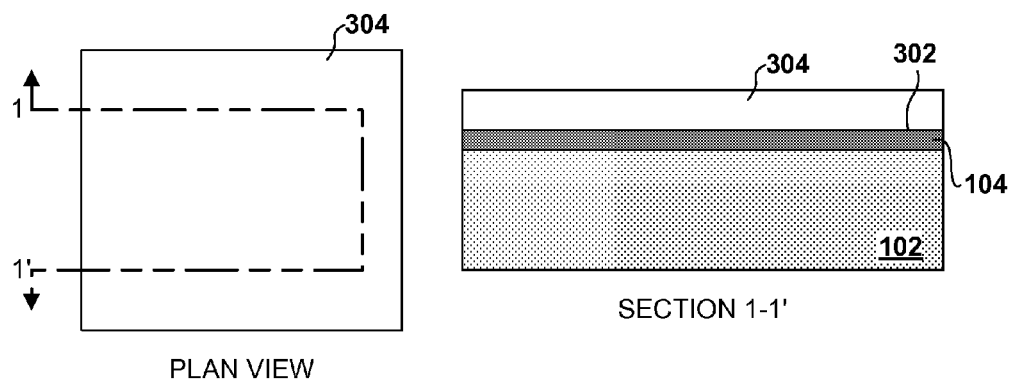

FIG. 3B illustrates a next part of the process. Starting with the build-up shown in FIG. 3A, a clear layer 304 is deposited onto surface 302 of planarizing layer 104 and then planarized using processes such as chemical mechanical polishing (CMP). Clear layer 304, when patterned and etched, will form the clear filter in the filter arrangement. Hence, clear layer 304 is made from a clear (i.e., substantially colorless) material that is optically transparent over at least the wavelength range of the color filters.

Figure 3C:
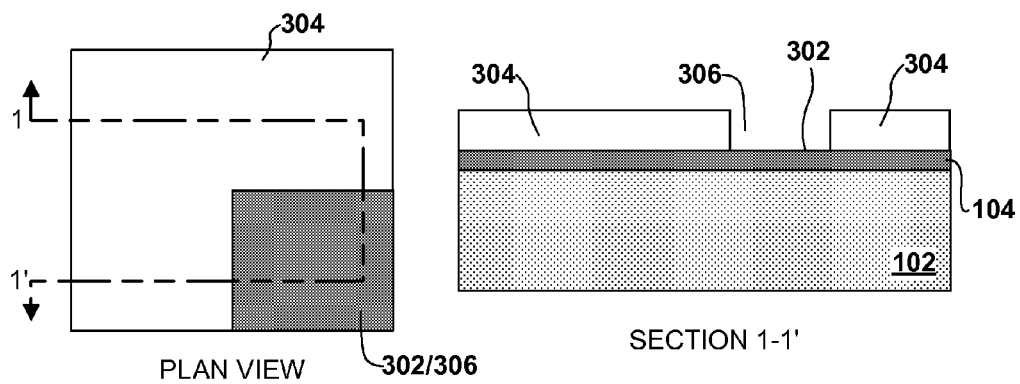

FIG. 3C illustrates a next part of the process. Starting with the build-up shown in FIG. 3B, an opening 306 into which a filter material can be deposited is formed in clear layer 304. In one embodiment, opening 306 can be formed by photolithographically patterning clear layer 304 and etching it with processes such as anisotropic etching, deep reactive ion etching (DRIE), and the like. In other embodiments, opening 306 can be formed differently, for example by laser ablation or laser etching. In the illustrated embodiment, opening 306 is used to form the green filter, but in other embodiments opening 308 can be used for a different color.

Figure 3D:
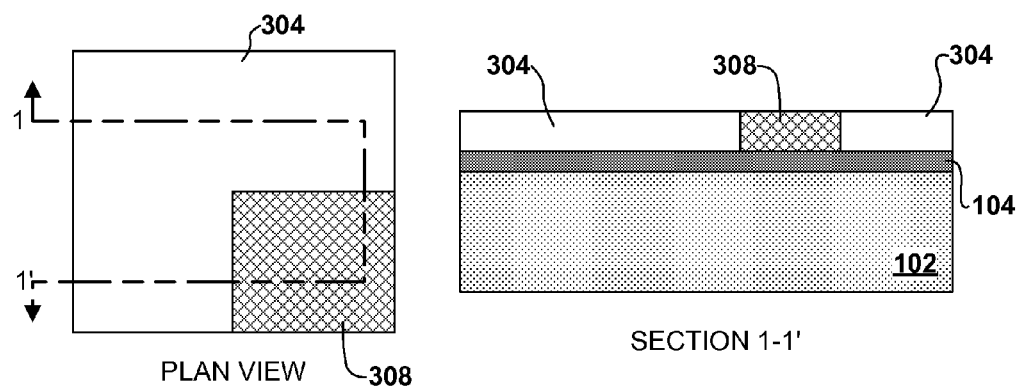

FIG. 3D illustrates a next part of the process. Starting with the build-up shown in FIG. 3C, a first color filter material 308 is deposited into opening 306 to form one of the color filters in color filter arrangement 100. In one embodiment first color filter material 308 can be directly deposited into opening 306, but in other embodiments first color filter material 308 can be deposited into opening 306 and over all or part of the surface of clear layer 304 and the excess first filter material removed from the field surrounding opening 306 with a process such as chemical mechanical polishing (CMP). In the illustrated embodiment first filter material 308 forms the green filter in color filter arrangement 100, but in other embodiments color filter material 308 can form one of the other color filters.

Figure 3E:
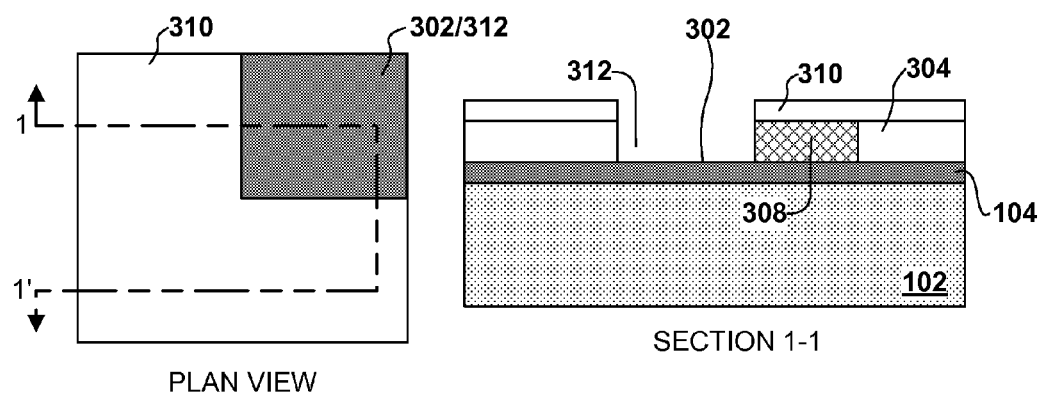

FIG. 3E illustrates a next part of the process. Starting with the build-up shown in FIG. 3D, a first hard mask layer 310 is deposited over clear layer 304 and first color filter material 308 and then planarized using processes such as chemical mechanical polishing (CMP). First hard mask layer 310 is clear (i.e., substantially colorless) and is optically transparent over at least the range of wavelengths filtered by the color filters. First hard mask layer 310 can be, but need not be, the same material used for clear layer 304. In one embodiment first hard mask layer 306 is an oxide layer, but in other embodiments other materials can be used for first hard mask layer 306, provided the chosen material meets optical performance and manufacturing requirements.

Once first hard mask layer 310 has been planarized, an opening 312 is formed in first hard mask layer 310 and clear layer 304, extending down to surface 302 of planarizing layer 104. In one embodiment, opening 312 can be formed by photolithographically patterning mask layer 310 and clear layer 304, and etching with processes such as anisotropic etching, deep reactive ion etching (DRIE), and the like. In other embodiments opening 312 can be formed differently, for example by laser ablation or laser etching. In the illustrated embodiment opening 312 is used to form a blue filter, but in other embodiments opening 312 can be used for a different color.

Figure 3F:
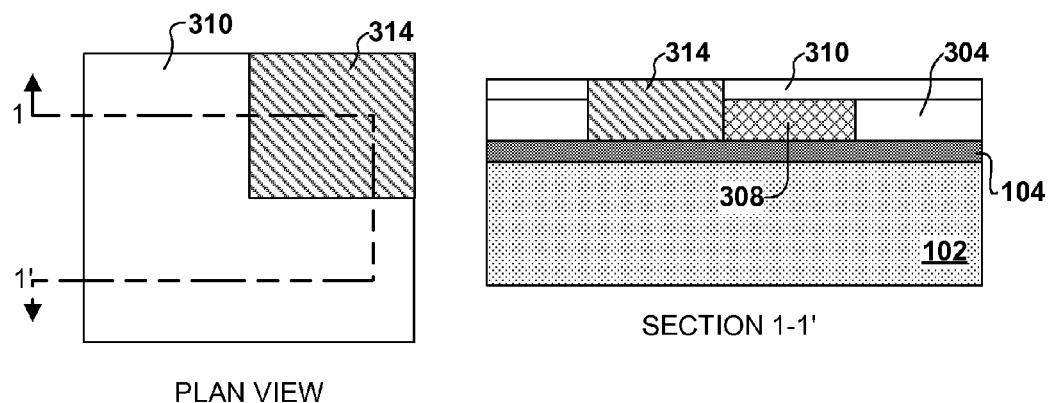

FIG. 3F illustrates a next part of the process. Starting with the build-up shown in FIG. 3E, a second color filter material 314 is deposited into opening 312 to form the second color filter in color filter arrangement 100. In one embodiment color filter material 314 can be directly deposited into opening 312, but in other embodiments second color filter material 314 can be deposited into opening 312 and over all or part of the surface of first hard mask 310, and the excess second color filter material removed from the field surrounding opening 312 with a process such as chemical mechanical polishing (CMP). In the illustrated embodiment second filter material 314 forms the blue filter in color filter arrangement 100, but in other embodiments second color filter material 314 can form one of the other color filters.

Figure 3G:
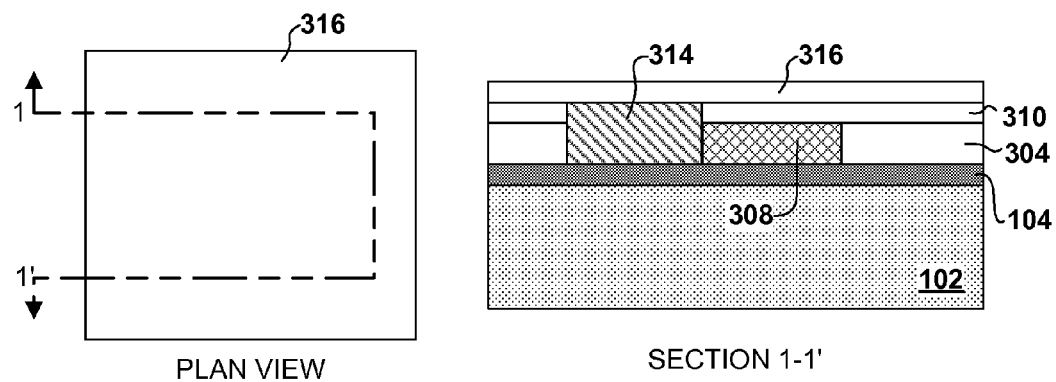

FIG. 3G illustrates a next part of the process. Starting with the build-up shown in FIG. 3F, a second hard mask layer 316 is deposited over the assembly and planarized using processes such as chemical mechanical polishing (CMP). Second hard mask layer 316 is clear (i.e., substantially colorless) and is optically transparent over at least the range of wavelengths filtered by the color filters. Second hard mask layer 316 can be, but need not be, the same material used for clear layer 304. In one embodiment, second hard mask layer 316 is an oxide layer, but in other embodiments other materials can be used provided the chosen material meets optical performance and manufacturing requirements. In one embodiment second hard mask layer 316 can be made of the same material as first hard mask layer 310, but in other embodiments the first and second hard mask layers need not be made of the same material.

Figure 3H:
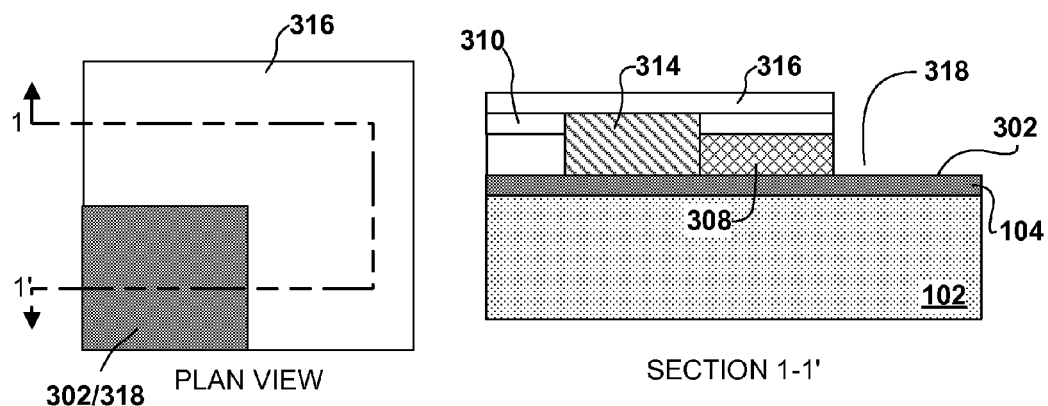

FIG. 3H illustrates a next part of the process. Starting with the build-up shown in FIG. 3G, an opening 318 is etched through first hard mask layer 310, second hard mask layer 316 and clear layer 304, extending down to surface 302 of planarizing layer 104. As with previous openings, opening 318 can be formed using photolithographic patterning together with etching processes such as anisotropic etching, deep reactive ion etching (DRIE), and the like. In other embodiments other processes, such as laser ablation or etching, can be used to form opening 318.

Figure 3I:
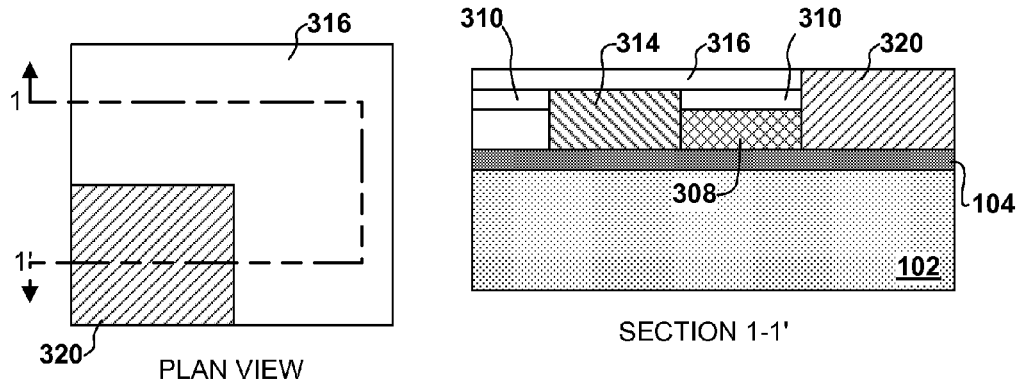

FIG. 3I illustrates the final part of the process. Starting with the build-up shown in FIG. 3H, a third color filter material 320 is deposited into opening 318 to form the third color filter of color filter arrangement 100. In one embodiment third color filter material 320 can be directly deposited into opening 318, but in other embodiments third color filter material 320 can be deposited into opening 318 and over all or part of the surface of second hard mask 316 and the excess third color filter material removed from the field surrounding opening 318 with a process such as chemical mechanical polishing (CMP). Regardless how color filter material 320 is deposited, second hard mask 316 and third color filter material 320 can be planarized to give the final assembly a substantially flat surface on which other elements, such as microlenses, can be formed. In the illustrated embodiment third color filter material 320 forms the red filter in color filter arrangement 100, but in other embodiments color filter material 314 can form one of the other color filters. The color filter arrangement shown in FIG. 3I is essentially the color filter arrangement 100 shown in FIGS. 1A-1B, although its elements are shown in FIG. 3I using different reference numerals.

Figure 3J:
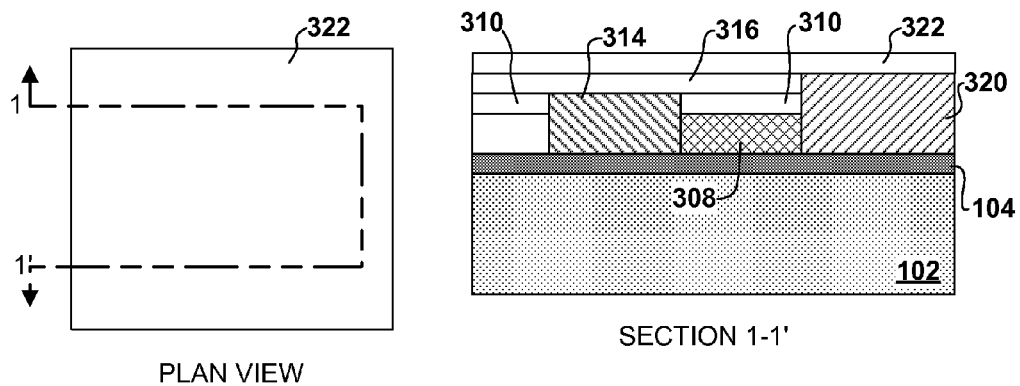

FIG. 3J illustrates an optional additional part of the process. Starting with the build-up shown in FIG. 3I, a planarized clear layer 322 is deposited over filter 320 and second hard mask layer 316. Planarized clear layer 322 is clear (i.e., substantially colorless) and is optically transparent over at least the range of wavelengths filtered by the set of color filters. In one embodiment, additional clear layer 322 can be made of the same material as clear layer 304, first hard mask layer 310, or second hard mask layer 316, but in other embodiments it can be a completely different material. Among other things, planarized clear layer 322 helps protect the underlying color filter arrangement. FIGS. 2B-2C illustrate frontside and backside illuminated images sensors that use the color filter arrangement of FIG. 3I. When the arrangement shown in FIG. 3J is used with the image sensors of FIGS. 2B-2C instead of the arrangement of FIG. 3I, microlenses 206 can be formed on additional clear layer 322 instead of being formed on the filter 320 and second hard mask layer 316.

The above description of illustrated embodiments of the invention, including what is described in the abstract, is not intended to be exhaustive or to limit the invention to the precise forms disclosed. Specific embodiments of, and examples for, the invention are described for illustrative purposes, but various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

The invention claimed is:

1. A process for forming a color filter arrangement, the process comprising:
   depositing a clear layer over a surface of a substrate, the substrate having a pixel array formed therein;
   patterning and etching the clear layer to form a first opening;
   depositing a first color filter material in the first opening;
   depositing a first clear hard mask layer over the clear layer and the first color filter material;
   patterning and etching the first clear hard mask layer and the clear layer to form a second opening;
   depositing a second color filter material in the second opening;
   depositing a second clear hard mask layer over the first clear hard mask layer and the second color filter material;
   patterning and etching the second clear hard mask layer, the first clear hard mask layer, and the clear layer to form a third opening; and
   depositing a third color filter material in the third opening.

2. The process of claim 1 wherein depositing each of the color filter materials comprises:
   depositing each color filter material in its respective opening and in the field surrounding the opening; and
   planarizing each color filter material to remove the part of the color filter material deposited in the field surrounding the opening.

3. The process of claim 1, further comprising planarizing the second clear hard mask and the third color filter layer.

4. The process of claim 1 wherein the first color filter layer is green, the second color filter layer is blue and the third color filter layer is red.

5. The process of claim 1 wherein the clear filter and at least one of the first clear hard mask layer and the second clear hard mask layer are made of the same material.

6. The process of claim 1 wherein the first clear hard mask layer and the second clear hard mask layer are made of the same material.

7. The process of claim 1, further comprising depositing a planarizing layer on the substrate before depositing the clear layer such that the color filter arrangement is formed on the planarizing layer.

8. The apparatus of claim 1, further comprising depositing a planarized clear layer on the second clear hard mask and on the third color filter.

\* \* \* \* \*